(12) United States Patent
Gaither et al.

(10) Patent No.: US 10,933,749 B2
(45) Date of Patent: Mar. 2, 2021

(54) SYSTEMS AND METHODS FOR DIRECTLY DELIVERING HIGH VOLTAGE TO APPLIANCES IN A VEHICLE

(71) Applicant: Toyota Motor Engineering & Manufacturing North America, Inc., Plano, TX (US)

(72) Inventors: Geoffrey David Gaither, Brighton, MI (US); Robert C. MacArthur, Ypsilanti, MI (US); Justin J. Chow, Los Angeles, CA (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/356,521

(22) Filed: Mar. 18, 2019

(65) Prior Publication Data
US 2020/0298705 A1 Sep. 24, 2020

(51) Int. Cl.
| | | |
|---|---|---|
| *B60L 1/00* | (2006.01) | |
| *G01R 31/382* | (2019.01) | |
| *B60R 16/033* | (2006.01) | |

(52) U.S. Cl.
CPC ............ *B60L 1/006* (2013.01); *B60R 16/033* (2013.01); *G01R 31/382* (2019.01)

(58) Field of Classification Search
CPC ...... B60L 1/006; B60R 16/033; G01R 31/382
See application file for complete search history.

(56) References Cited

U.S. PATENT DOCUMENTS

| | | | |
|---|---|---|---|
| 5,586,546 A | 12/1996 | Ashcroft et al. | |
| 6,596,941 B2* | 7/2003 | Tripoli | B60R 11/02 174/135 |
| 7,231,994 B2* | 6/2007 | Buglione | B60L 50/16 180/65.31 |
| 7,654,349 B2 | 2/2010 | Lee et al. | |
| 7,673,713 B2* | 3/2010 | Betz | B60L 58/10 180/65.21 |
| 8,640,799 B2* | 2/2014 | Beeson | B60K 25/00 180/53.5 |
| 9,676,288 B2* | 6/2017 | Chang | H02J 7/0047 |
| 10,081,261 B2 | 9/2018 | Grimes et al. | |
| 10,227,067 B2* | 3/2019 | Bell | B60L 58/15 |
| 10,259,443 B2* | 4/2019 | Liang | B60W 30/18054 |
| 10,418,827 B2* | 9/2019 | Shin | H02J 7/0026 |
| 2004/0027001 A1 | 2/2004 | Reed, III | |
| 2008/0217327 A1* | 9/2008 | Herrera | H05B 6/6426 219/717 |
| 2008/0271937 A1* | 11/2008 | King | B60W 10/30 180/165 |
| 2012/0286720 A1 | 11/2012 | Fassnacht et al. | |

(Continued)

*Primary Examiner* — Thomas J. Hiltunen
(74) *Attorney, Agent, or Firm* — Christopher G. Darrow; Darrow Mustafa PC (57) ABSTRACT

System, methods, and other embodiments described herein relate to controlling power delivery to a consumer appliance in a vehicle. In one embodiment, a method includes receiving a connection signal from the consumer appliance indicating presence of the consumer appliance. The method also includes directly providing electrical power from a propulsion device providing DC voltage to the consumer appliance without substantially lowering a voltage level of the propulsion device.

20 Claims, 5 Drawing Sheets

(56) References Cited

U.S. PATENT DOCUMENTS

| | | | |
|---|---|---|---|
| 2013/0184968 A1* | 7/2013 | Kumano | F02D 41/0055 |
| | | | 701/102 |
| 2015/0112522 A1* | 4/2015 | Liang | B60L 1/02 |
| | | | 701/22 |
| 2017/0158058 A1 | 6/2017 | Lee et al. | |
| 2020/0094679 A1* | 3/2020 | Mattmuller | B60L 1/006 |

* cited by examiner

SYSTEMS AND METHODS FOR DIRECTLY DELIVERING HIGH VOLTAGE TO APPLIANCES IN A VEHICLE

TECHNICAL FIELD

Embodiments described herein generally relate to supplying power in vehicles. More specifically, the embodiments generally relate to systems and methods of delivering power directly from a propulsion device to appliances installed in the vehicle.

BACKGROUND

Electrical appliances are sometimes found in vehicles and can utilize the conventional 12-volt automotive battery as a power source to perform a task, such as to manipulate temperature, produce light, motion, etc. These appliances may receive power from an alternating current ("AC") source, for example, a 120-volt AC outlet residing on the vehicle. The AC source may be produced by a conversion from the 12-volt direct current ("DC") battery, i.e., an inverter is used to convert the voltage from DC to AC. There may be other types of conversion and/or more than one conversion that conditions the originating voltage source to the final voltage source used by the appliance. Voltage conversion interfaces, such as DC to AC, AC to DC and DC to DC can lead to non-recoverable power losses. These conversions may cause a user of the appliance to lose operational time if, for example, the 12-volt battery is not receiving a replenishing charge. Furthermore, the standard 12-volt automotive battery may not be able to deliver enough power to these appliances for an appreciable amount of time due to limited energy storage capability of the battery.

SUMMARY

The systems and methods are disclosed herein that relate to a manner of controlling power delivery to a consumer appliance connected to a vehicle by providing a suitable energy source for the consumer appliances and promoting extended usage time. In one embodiment, a power delivery system for controlling a power delivery to consumer appliances in the vehicle is disclosed. The power delivery system includes one or more processors and a memory communicably coupled to the one or more processors. The memory stores a connection module including instructions that when executed by the one or more processors cause the one or more processors to receive a connection signal from the consumer appliance indicating presence of the consumer appliance. The memory stores a delivery module including instructions that when executed by the one or more processors cause the one or more processors to directly provide electrical power from a propulsion device providing DC voltage to the consumer appliance without substantially lowering a voltage level of the propulsion device.

In another embodiment, a method for controlling a power delivery to appliances in a vehicle is disclosed. The method includes receiving a connection signal from the consumer appliance indicating presence of the consumer appliance. The method also includes directly providing electrical power from a propulsion device providing DC voltage to the consumer appliance without substantially lowering a voltage level of the propulsion device.

In another embodiment, a non-transitory computer-readable medium for controlling a power delivery to appliances in a vehicle is disclosed. The non-transitory computer-readable medium stores instructions that when executed by one or more processors cause the one or more processors to perform the disclosed functions. The instructions include instructions to receive a connection signal from the consumer appliance indicating presence of the consumer appliance. The instructions include instructions to directly provide electrical power from a propulsion device providing DC voltage to the consumer appliance without substantially lowering a voltage level of the propulsion device.

Embodiments of the present application can be more clearly understood with relation to the figures and the description below.

BRIEF DESCRIPTION OF THE DRAWINGS

So that the manner in which the above recited features of the present disclosure can be understood in detail, a more particular description of the disclosure, briefly summarized above, may be had by reference to the embodiments, some of which are illustrated in the appended drawings. It is to be noted, however, that the appended drawings illustrate only typical embodiments of this disclosure and are therefore not to be considered limiting of its scope. The disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Systems and methods and other embodiments associated with controlling electrical power delivery to a consumer appliance connected to an electric or a hybrid electric vehicle are disclosed herein. Consumer appliances, for example, grills, stoves, refrigerators, microwave ovens, heaters, speakers, etc., are commonplace for recreational events, such as tailgating, camping and so on. Currently, some of these consumer appliances are powered from an energy source integrated with the vehicle. Further, one current power delivery method for these consumer appliances is a direct connection from the consumer appliance to a DC source (e.g., 12-volt automotive battery). In other instances where the consumer appliance requires an AC source, a 120-volt AC connection can be derived from a DC/AC inverter connected to the 12-volt battery to supply power. However, as discussed above, both these methods have their drawbacks. On one hand, the 12-volt battery, whether supplying energy directly or through an inverter, simply does not have enough energy capacity to sustain one or more high-power consumer appliances (e.g., greater than 500 Watts) for a realistically useful period of time. On the other hand, the inverter for AC consumer appliances introduces power losses when transforming the voltage, which translates into reduced operational time. This disclosure presents systems and methods for delivering power to consumer appliances connected to the vehicle and addresses power losses and available energy concerns that may limit their use.

Accordingly, in one embodiment, a power delivery system directly provides electrical power to the consumer appliance from a propulsion device providing DC voltage without substantially lowering a voltage level of the propulsion device or converting a voltage type of the propulsion device from DC to AC. For example, in one embodiment, the system determines whether the consumer appliance is connected to the vehicle and identifies power requirements for the appliance. The system, in one arrangement, receives a state of the propulsion device and outputs a supply signal to a power distributor in response to determining that the propulsion device can fulfill the power requirements. As such, in one instance, the power distributor delivers the electrical power from the propulsion device to the consumer appliance in response to the supply signal.

Alternatively, the power delivery system, in another arrangement, outputs the supply signal to the propulsion device in response to determining that the traction battery can fulfill the power requirements and directly delivers the electrical power to the consumer appliance in response to the supply signal. Furthermore, in one arrangement, the system selectively disengages one or more consumer appliances from the propulsion device battery based on the battery state.

In either case, the system communicates with a vehicle connected consumer appliance and the propulsion device to determine whether the propulsion device can fulfill the power required by the appliance. If sufficient energy is available, the system, in one or more embodiments, delivers power to the consumer appliance if the appliance is properly connected to the vehicle. The system may monitor the propulsion device state, in one arrangement, and may remove the power from one or more consumer appliances if the condition of the propulsion device dictates the removal.

Figure 1:
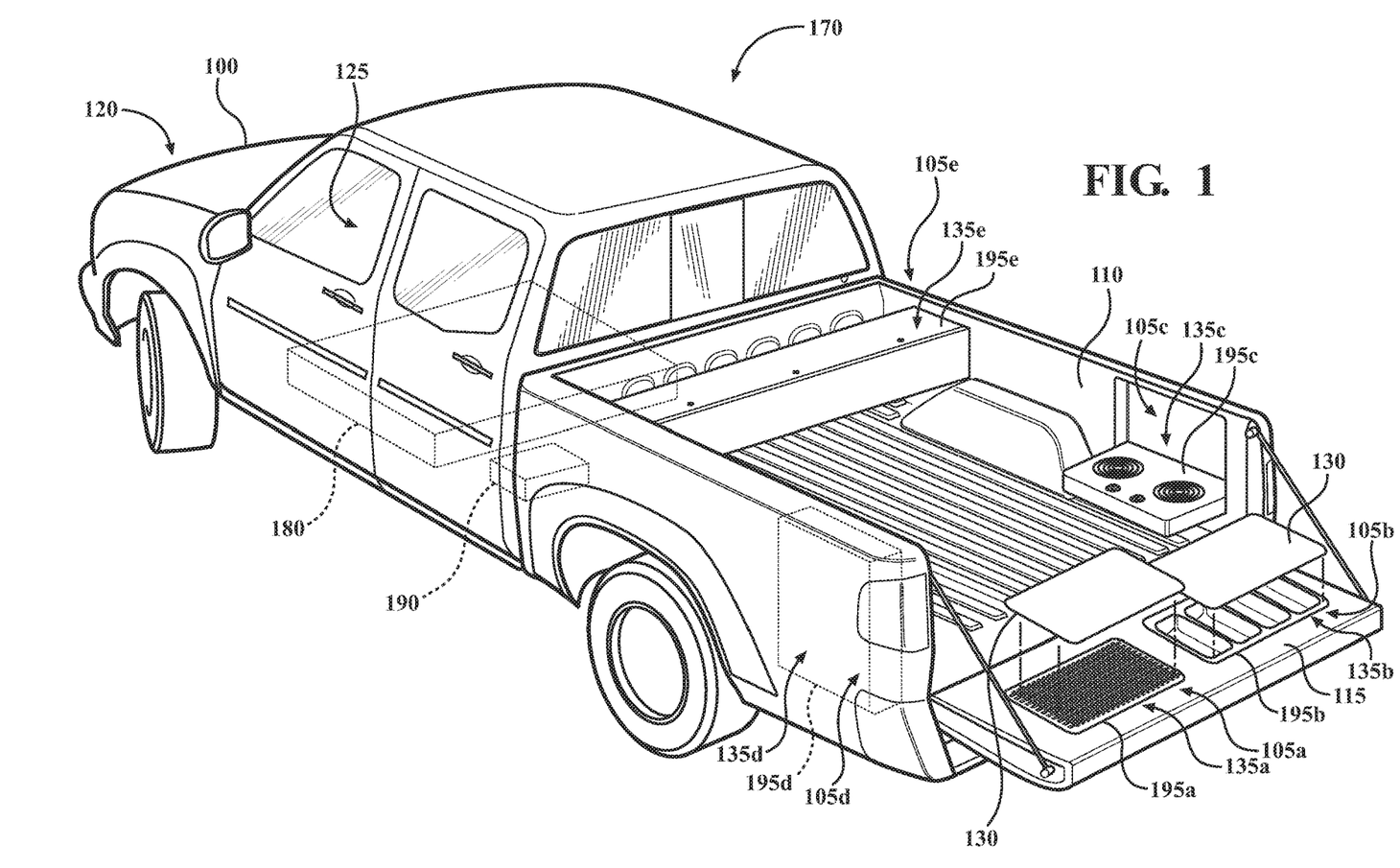
FIG. 1 is a perspective view of an example of a vehicle that includes a power delivery system for delivering electrical power to consumer appliances connected to the vehicle.

FIG. 1 is an example of a vehicle 100 that includes a power delivery system 170. The power delivery system 170 is implemented to perform methods and other functions as disclosed herein for controlling power delivery to consumer appliances 195, for example, 195a-195e, connected to the vehicle 100. Furthermore, the power delivery system 170 includes a propulsion device 180, a power distributor 190 and the consumer appliance 195. As described herein, the power delivery system 170 interacts with various subsystems on and off the vehicle 100 to effectively deliver power to the one or more consumer appliances 195 connected to the vehicle 100.

The propulsion device 180 includes an energy source that delivers the electrical power to the vehicle 100 for a period of time. The propulsion device 180 provides the electrical power to move the vehicle 100. The vehicle 100 includes an electric motor system 242 (FIG. 2), i.e., traction motor, and the propulsion device 180 is coupled to the electric motor system 242 for propulsion of the vehicle 100. The propulsion device 180 is considered to be "high-voltage." For example, the propulsion device 180 is capable of outputting a voltage greater than 60 VDC. When the consumer appliance 195 is connected to the vehicle 100, as set forth below, the electrical power is directly provided from the propulsion device 180 providing a DC voltage to the consumer appliance 195 without substantially lowering a voltage level of the propulsion device 180 or without converting a voltage type of the propulsion device 180 from DC to AC.

Not substantially lowering the voltage level indicates that a DC/DC conversion utilizing a DC voltage converter is not taking place between the propulsion device 180 and the consumer appliance 195. However, the idea of not substantially lowering a voltage level may not include a voltage level that is lowered between the propulsion device 180 and the consumer appliance 195 as a result of a voltage drop across a switching device, for example, 0.1 Volts, 0.5 Volts, 1 Volt, 2 Volts, 3 Volts, etc. In other words, a voltage level may not be considered to be substantially lowered when a voltage drop occurs across the switching device that is energized, for example, a contactor, a relay, a solid-state device operating as an on/off switch (i.e., low "on" resistance mode), etc. To minimize the voltage drop across the switching device when it is energized, the switching device may be appropriately sized for the amount of current that is expected to be delivered to the consumer appliance 195. It should be appreciated that the switching devices mentioned above and hereinafter are not part of a switch mode power device, such as a power supply, converter, inverter, etc.

Figure 2:
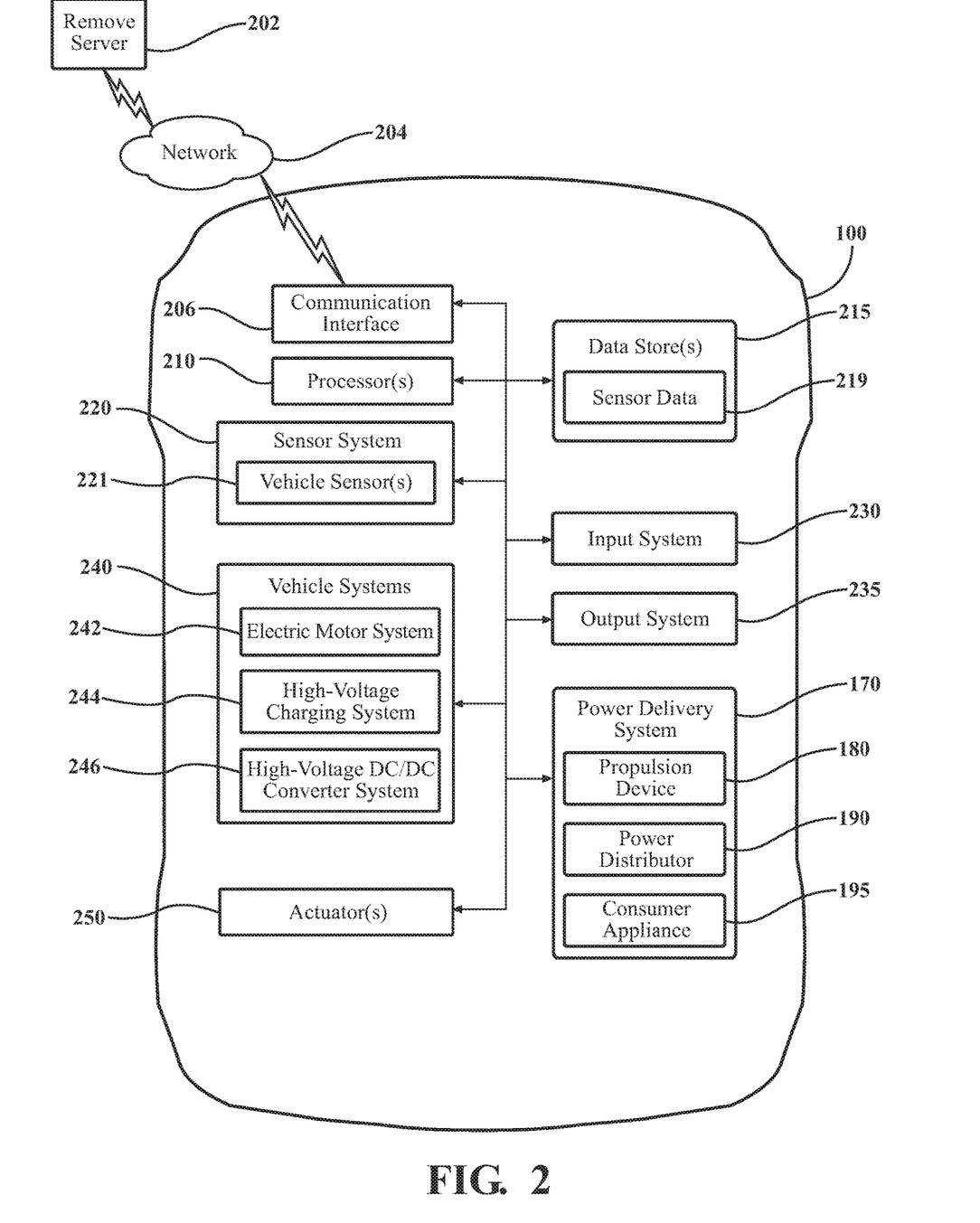
FIG. 2 illustrates one embodiment of a vehicle within which systems and methods disclosed herein may be implemented.

In one arrangement, the propulsion device 180 includes a traction battery as an energy source, such as a lithium-ion traction battery, Li-ion polymer traction battery, nickel metal hydride traction battery, etc. In another arrangement, the propulsion device 180 includes a hydrogen-based fuel cell as an energy source. In yet another arrangement, the propulsion device 180 includes an ultracapacitor, i.e., a supercapacitor, as an energy source. The propulsion device 180 may include a combination of energy sources. The propulsion device 180 may include device sensors that monitor, for example, the voltage, current, temperature, etc., of the propulsion device 180. The propulsion device 180 may include a device controller that processes the device sensors and controls the connection of the propulsion device 180 to vehicle systems 240 of the vehicle 100, for example, the electric motor system 242, a high-voltage charging system 244, a high-voltage DC/DC converter system 246, etc., as shown in FIG. 2.

The power distributor 190 includes a switching device that connects the propulsion device 180 to the consumer appliance 195. The switching device may be, for example, a contactor, a relay, a solid-state device operating as an on/off switch (i.e., low "on" resistance mode), etc. The power distributor 190 may include one or more switching devices that may be used to connect multiple consumer appliances 195 to the propulsion device 180. The power distributor 190 may be configured to receive a supply signal, as set forth below, and engage and/or disengage one or more consumer appliances 195. The power distributor 190 may be appropriately sized to minimize the voltage drops across the switching devices, for example, 0.1 Volts, 0.5 Volts, 1 Volt, 2 Volts, 3 Volts, etc.

The consumer appliance 195 is an electrical device connected to the vehicle 100 that performs some useful task for a user, such as to manipulate temperature (e.g., a refrigerator, microwave oven, food warmer, stove, heater, air conditioner, etc.), produce light (e.g., spot light, flood light, etc.), produce motion and/or vibration (e.g., fan, blender, hot tub jets, etc.), produce sound (speakers, sirens, etc.), etc. This appliance list is non-exhaustive, but the consumer appliance 195 does not include, for example, high-voltage components utilized for vehicular functions, such as vehicle heating, ventilation and air conditioning ("HVAC") components (e.g., high-voltage air conditioning compressor, interior cabin electrical heating elements), high-voltage engine/ transmission heaters, etc. The consumer appliance 195 is intended to be easily accessible by a user. For example, the consumer appliance 195 is not located in an under-hood environment 120, behind the instrument panel within an interior cabin 125 of the vehicle 100, underneath the vehicle 100, etc.

As shown in FIG. 1, the vehicle 100 includes the consumer appliance 195a, e.g., an electric stove, 195b, e.g., a food warmer, 195c, e.g., a stowable electric stove, 195d, e.g., a microwave oven, and 195e, e.g., a refrigerator. In one arrangement, the vehicle 100 includes a compartment 105, e.g., 105a-105e, accessible from an exterior of the vehicle 100 and the compartment 105 is configured to receive the consumer appliances 195a-195e, respectively. For example, the compartment 105c may be inset within a truck bed sidewall 110 of the vehicle 100 and be configured to receive the consumer appliance 195c. As another example, the compartment 105a may be inset within a tailgate 115 of the vehicle 100 and be configured to receive the consumer appliance 195a.

The consumer appliance 195, in one or more arrangements, is connected to the vehicle 100. For example, the consumer appliance 195, as set forth above, may be received by the compartment 105. The compartment 105 may include fasteners, for example, screws, clips, grooves, etc., that connect, i.e., fastenedly couple, the consumer appliance 195 to the vehicle 100. The consumer appliance 195 may be permanently connected to the vehicle 100. For example, the vehicle manufacturer may fixedly couple the consumer appliance 195 to the vehicle 100 within the compartment 105. The consumer appliance 195 may be connected such that it is flush with an exterior surface of the vehicle 100, such as flush with a surface of the tailgate 115, flush with a surface of the truck bed sidewall 110, etc. The consumer appliance 195 may be received by the compartment 105 located in an easily accessible location within an interior cabin 125 of the vehicle 100.

The consumer appliance 195 may be stowable. In other words, the consumer appliance 195, once connected to the vehicle 100, may be movable from a stowed position, where it may be flush with an exterior surface of the vehicle 100, to an unstowed position, as shown for the consumer appliance 195c in FIG. 1. The consumer appliance 195 may include a lid 130 that covers the consumer appliance 195. The lid 130 may assist the consumer appliance 195 to remain flush with the exterior surface of the vehicle 100. The lid 130 may include fasteners that hold to the lid 130 to the consumer appliance 195.

With continued reference to FIG. 1, the compartment 105 may include an appliance connector 135, e.g., 135a-135e. The appliance connector 135 is an interface that allows for the consumer appliance 195 to receive the electrical power from the propulsion device 180 and to communicate with the power delivery system 170. As set forth below, the consumer appliance 195 communicates with the power delivery system 170 via the appliance connector 135 so that presence and power requirements of the consumer appliance 195 may be determined. The appliance connector 135 may be mechanically and electrically designed such that communication is possible only if the consumer appliance 195 is completely received by the compartment 105, for example, the consumer appliance 195 is fastenedly or fixedly coupled to the vehicle 100, and the consumer appliance 195 is completely mated with the appliance connector 135. A high voltage interlock loop circuit may be used to ensure that the consumer appliance 195 is connected to the appliance connector 135, as described below.

The consumer appliance 195 is configured to operate at the high-voltage DC voltage levels that are output from the propulsion device 180, as set forth above (i.e., greater than 60 VDC and less than or equal to 1500 VDC). Therefore, standard consumer appliances, which are typically supplied by a 120 VAC source may not be compatible with the high-voltage propulsion device 180.

Referring to FIG. 2, an example of the vehicle 100 is illustrated. As used herein, a "vehicle" is any form of motorized transport. In one or more implementations, the vehicle 100 is an automobile, for example, a pure electric vehicle ("EV"), a hybrid electric vehicle ("HEV"), a plug-in hybrid vehicle ("PHEV"), a fuel cell electric vehicle ("FCEV"), etc. While arrangements will be described herein with respect to automobiles, it will be understood that embodiments are not limited to automobiles. In some implementations, the vehicle 100 may be any other form of motorized transport that, for example, benefits from the systems and methods as discussed herein.

The vehicle 100 also includes various elements. It will be understood that in various embodiments it may not be necessary for the vehicle 100 to have all the elements shown in FIG. 2. The vehicle 100 can have any combination of the various elements shown in FIG. 2. Further, the vehicle 100 can have additional elements to those shown in FIG. 2. In some arrangements, the vehicle 100 may be implemented without one or more of the elements shown in FIG. 2. Further, while the various elements are shown as being located within the vehicle 100 in FIG. 2, it will be understood that one or more of these elements can be located external to the vehicle 100. Further, the elements shown may be physically separated by large distances.

Some of the possible elements of the vehicle 100 are shown in FIG. 2 and will be described along with subsequent figures. However, a description of many of the elements in FIG. 2 will be provided after the discussion of FIGS. 3-5 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

The vehicle 100 may be configured so that the power delivery system 170, the sensor system 220 and other components of the vehicle 100 can communicate with each other using a controller area network (CAN) bus or the like. Via the CAN bus and/or other wired or wireless mechanisms, the power delivery system 170, elements and/or systems described herein may transmit messages to various devices in the vehicle 100 and/or receive messages from the various devices, e.g., controllers, actuators, sensors, etc.

The power delivery system 170 may be configured to operate via a communication interface 206 in a networked environment supporting connections to one or more remote computers for wireless communication between the vehicle 100 and a remote server 202. The power delivery system 170 may function to control processor(s) 210 to transmit data to the remote server 202 via the communication interface 206 to request, for example, the power requirements for various types of consumer appliances 195. Further, the power delivery system 170 may receive data from the remote server 202 via the communication interface 206, e.g., power specifications for the consumer appliance 195, power delivery commands from a wireless device, etc.

The remote server 202 is a computer including a processor and a memory, the memory stores instructions which may be executed by the processor. The remote server 202 can communicate, via the network 204 with the vehicle 100, and thus the power delivery system 170, via the communication interface 206.

The communication interface 206 may be configured to establish and enable continued and uninterrupted interaction between the vehicle 100 and external sensors, other vehicles, other computer systems, various external computing and communications systems and networks (such as a network 204, a satellite system, a cellular phone/wireless communication system), and also remote users or entities, to enable and/or facilitate performance of one or more of the functions described herein. The communication interface 206 may include interfaces enabling communication in a wide area network (WAN), a wireless telecommunications network, and/or any other suitable communications networks (such as or including the network 204, for example).

The network 204 represents one or more mechanisms by which the vehicle 100 and the remote server 202 may communicate with each other. The network 204 may include one or more known networks and/or networking technologies, such as wireless communication networks (e.g., Bluetooth®, IEEE 802.11, etc.), a cellular network, local area networks (LAN) and/or wide area networks (WAN), including the Internet, providing data communication services.

Figure 3:
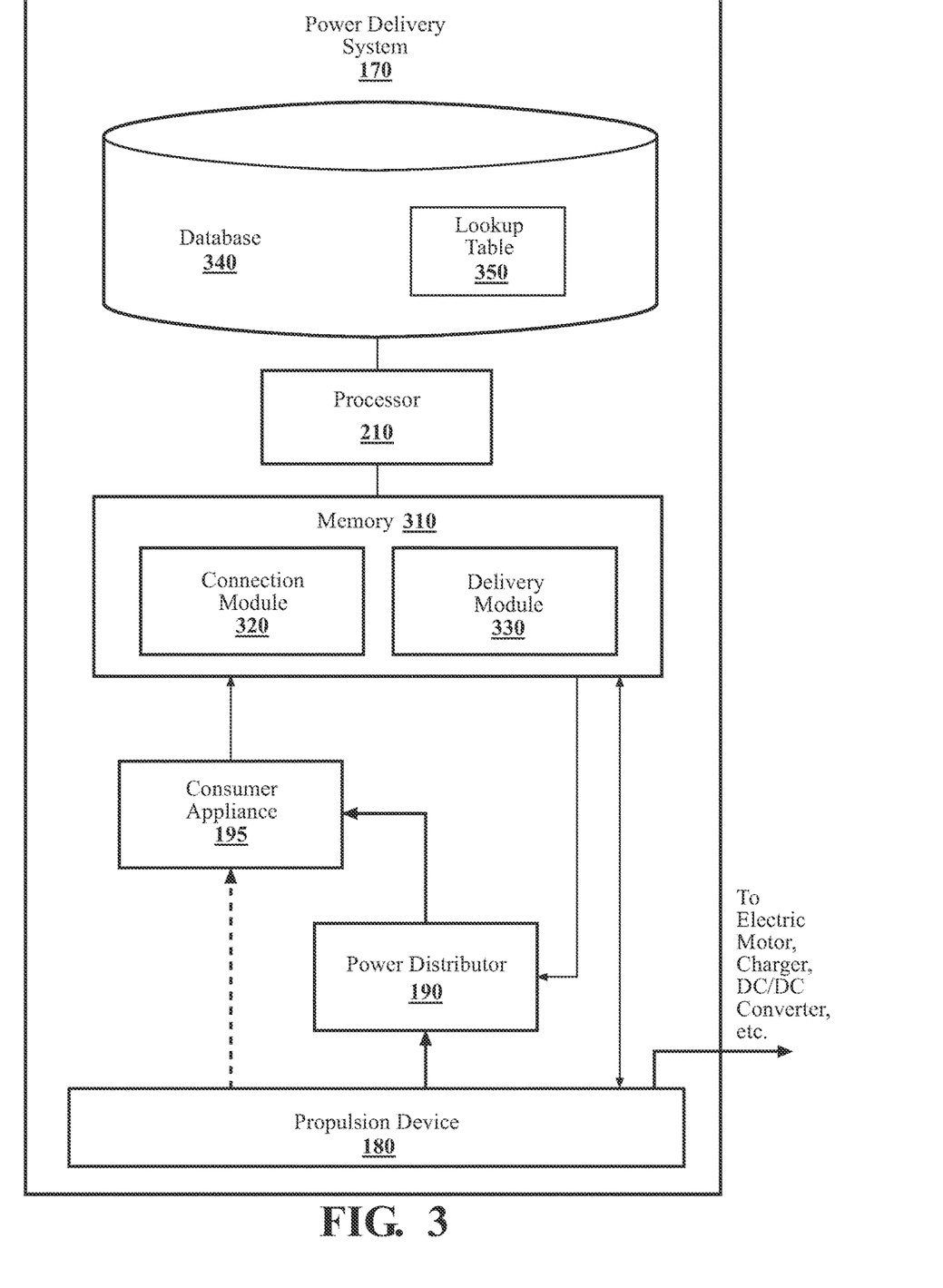
FIG. 3 is a schematic of the power delivery system according to one or more embodiments.

With reference to FIG. 3, one embodiment of the power delivery system 170 of FIG. 1 is further illustrated. The power delivery system 170 is shown as including a processor 210 from the vehicle 100 of FIG. 2. Accordingly, the processor 210 may be a part of the power delivery system 170, the power delivery system 170 may include a separate processor from the processor 210 of the vehicle 100. Further, the power delivery system 170 may be configured for communicating with the processor 210 through the CAN bus or via various other wired and/or wireless networking technologies, e.g., cellular, BLUETOOTH®, a universal serial bus (USB), Wi-Fi™, wired and/or wireless packet networks, etc. In either case, the processor 210 is illustrated as part of the power delivery system 170 for purposes of explanation.

In one embodiment, the power delivery system 170 includes a memory 310 that stores a connection module 320 and a delivery module 330. The memory 310 is a random-access memory (RAM), read-only memory (ROM), a hard-disk drive, a flash memory, or other suitable memory for storing the connection module 320 and the delivery module 330. The connection module 320 and the delivery module 330 are, for example, computer-readable instructions that when executed by the processor 210, cause the processor 210 to perform the various functions disclosed herein.

The power delivery system 170 includes database 340. The database 340 is, for example, an electronic data structure stored in the memory 310 or another electronic database that is configured with routines that can be executed by the processor 210 for analyzing stored data, providing stored data, organizing stored data, and so on. Thus, in one embodiment, the database 340 store data used/provided by the connection module 320 and the delivery module 330 in executing various functions, as set forth below.

The connection module 320, in one embodiment, includes instructions that function to control the processor 210 to receive a connection signal from the consumer appliance 195 indicating presence of the consumer appliance 195. The connection module 320 may determine presence of the consumer appliance 195, i.e., that the consumer appliance 195 is connected to the appliance connector 135 and attempting to communicate. For example, the connection module 320 may determine that the connection signal changes state from a "low" value to a "high" value, the connection signal periodically changes state for a period of time, etc. The connection module 320 may determine presence of the consumer appliance 195 by determining that the connection signal transitions to a known state. For example, the connection module 320 may compare a state of the connection signal to the known state that is, for instance, stored in a lookup table 350, as set forth below. The connection module 320 may use any suitable method to determine presence of the consumer appliance 195 once it is connected to the appliance connector 135 and attempting to communicate. If the connection signal does not indicate presence of the consumer appliance 195, the connection module 320 may ignore the connection signal and output a connection status signal to the power delivery system 170 indicating an invalid consumer appliance connection. i.e., the consumer appliance 195 is not connected.

The connection signal, in one or more arrangements, includes the power requirements for the consumer appliance 195. The connection signal may be an analog value that corresponds to the amount of power required by the consumer appliance 195. The connection signal may have only one of two valid values, for example, a "high" analog value or a "low" analog value. For example, a high analog value may correspond to a power requirement of 1000 Watts and a low analog value may correspond to 0 Watts, i.e., the consumer appliance 195 is requiring no power and is "off." The connection signal may have more than two analog values corresponding to a range of power requirements. For example, the consumer appliance 195 may be mechanically and/or electrically configured to provide different analog values to the connection module 320 corresponding to different power requirements, such as a high/medium/low rotary switch supplying three different analog values, or a potentiometer supplying a range of analog values. The connection signal may be an analog value that corresponds to a type of consumer appliance 195.

The connection signal may be a digital value representing the power required by the consumer appliance 195, for example, a digital value representing 1000 Watts, 1250 Watts, etc. The connection signal may be a digital value representing a type of consumer appliance 195. The consumer appliance 195 may include a processor and a memory that can output the analog value and/or the digital value.

In one or more arrangements, the database 340 includes the lookup table 350, as shown in FIG. 3. The lookup table 350, for example, may be accessed by the connection module 320 and may include various power requirement values corresponding, i.e., cross-referenced with, the analog and digital values received by the connection module 320 via the connection signal. The lookup table 350 may be accessed to cross-reference the analog or digital value representing a type with the power required by the consumer appliance 195, for example, a digital value of 0F hex represents a type of electric stove that requires 1000 Watts of power to operate. As set forth above, the lookup table 350 may contain known states that can be accessed by the connection module 320 to determine presence of the consumer appliance 195.

In either case, the lookup table 350 may be used to provide an associated valid power requirement value for various analog and digital values received by the connection module 320. If there is a valid power requirement value associated with the analog or digital value, the connection module 320 may store the valid power requirement value in the database 340. If the analog or digital values are out of the range of the lookup table 350, i.e., there is not a valid power requirement value cross-referenced with the analog or digital values received from the consumer appliance 195, the connection module 320 may ignore the connection signal and output a connection status signal indicating an invalid consumer appliance 195 connection. The connection module 320 may use any suitable method to validate that the connection signal received from the consumer appliance 195 contains a valid power requirement value. The valid power requirement value may be stored in the database 340.

Alternatively, the connection signal may include an Internet web address that can be accessed to determine the power requirements of the consumer appliance 195. The connection module 320 may access the remote server 202 via the communication interface 206 to retrieve the valid power requirement value and store it in the database 340. The connection module 320 may validate the power requirement value received from the remote server 202 by accessing the lookup table 350 to determine if a valid power requirement value is associated with the power requirement value received from the remote server 202.

The consumer appliance 195 may continually provide the connection signal to the connection module 320. For example, the consumer appliance 195 may provide or maintain the analog or digital values to the connection module 320 while the consumer appliance 195 is connected to the vehicle 100, i.e., while the consumer appliance 195 is fastenedly or fixedly coupled to the vehicle 100, and the consumer appliance 195 is completely mated with the appliance connector 135. If, for any reason, the consumer appliance 195 does not provide or maintain the connection signal, the connection module 320 may output a connection status signal indicating an invalid consumer appliance 195 connection. For example, if the power delivery system 170 is providing power to the consumer appliance 195 and the appliance became disconnected, the consumer appliance 195 would not be able to provide the connection signal to the connection module 320. As set forth below, power is removed from the consumer appliance 195 when a connection status signal indicates an invalid consumer appliance 195 connection.

Additionally, or in the alternative, the power delivery system 170 may include a high voltage interlock loop ("HVIL") circuit between the one or more consumer appliances 195 and the propulsion device 180. The HVIL circuit may protect against unintended access to a high-voltage component. The propulsion device 180 may source and sink an electrical circuit that runs through every consumer appliance 195 via the appliance connector 135. A break, i.e., open circuit condition, in the electrical circuit may cause the propulsion device 180 to remove the electrical power from every consumer appliance 195. For example, if a consumer appliance 195 becomes disconnected from an appliance connector 135, e.g., a user attempts to remove the consumer appliance 195 from the compartment, excessive vibrations causing the appliance connector 135 to become unmated from the consumer appliance 195, etc., the propulsion device 180 may recognize the break in the electrical circuit and remove the electrical power.

The consumer appliance 195 may update the power requirement at any time. For example, a user may change the setting on the consumer appliance 195 to consume more or less power. In this case, the connection module 320 determines if the updated power requirement is valid, as set forth above, and updates the connection status signal accordingly.

With reference to FIG. 3, the delivery module 330, in one embodiment, includes instructions that function to control the processor 210 to directly provide the electrical power from the propulsion device 180 providing DC voltage to the consumer appliance 195 without substantially lowering the voltage level or without converting the voltage type from DC to AC. By using the high-voltage propulsion device 180 without substantially lowering the voltage level, as set forth above, or converting the voltage type to AC, the power delivery system 170 eliminates converter (i.e., DC/DC, DC/AC and/or AC/DC) power losses and provides a suitable energy source for the consumer appliances 195. The propulsion device 180 may extend the time that a user can operate consumer appliances 195, as compared to a 12-volt automotive electrical system source. For example, a 1000-Watt consumer appliance supplied either directly from a standard 12-volt battery or from a converted DC/AC source originating from the 12-volt battery would deplete the battery in well under an hour. On the other hand, a fully charged, pure EV traction battery with a typical rating of 25 kWh would provide enough power for many hours.

The delivery module 330, in one embodiment, includes instructions that function to control the processor 210 to receive a propulsion device 180 state from the propulsion device 180. In one embodiment, the propulsion device 180 determines a propulsion device state from, for example, the device sensors and device controller, as set forth above, that includes at least one of an available energy, a state of charge, an output voltage, and a propulsion device temperature. The propulsion device 180 may broadcast the propulsion device state to the delivery module 330 in a wired or wireless fashion. The delivery module 330 may determine the available energy from the propulsion device 180 from via the propulsion device state. The delivery module 330 may consider one or more propulsion device state parameters, i.e., the available energy, the state of charge, the output voltage, and the propulsion device temperature, to adjust the available energy from the propulsion device 180. For example, the delivery module 330 may derate the available energy due to an excessive propulsion device temperature.

The delivery module 330, in one embodiment, determines whether the propulsion device state fulfills the consumer appliance 195 power requirement. The delivery module 330 may compare the available energy from the propulsion device 180 with the valid power requirement value stored in the database 340 for the consumer appliance 195. Specifically, the delivery module 330 determines an operating time, i.e., how long a typical consumer appliance will operate, for example, one minute, thirty minutes, one hour, etc., and compares the available energy to the power required by the appliance for the operating time. The delivery module 330 determines if the propulsion device state, and thus the propulsion device 180, fulfills the power requirement of the consumer appliance 195. The delivery module 330 may determine the operating time by accessing the lookup table 350 and cross-referencing the power requirement value and/or the consumer appliance type to an operating time. The delivery module 330 may use a default operating time, such as one minute, two minutes, etc. The delivery module 330 may access the remote server 202 via the communication interface 206 to retrieve an operating time.

With continued reference to FIG. 3, in response to determining the propulsion device state fulfills the power requirements, the delivery module 330, in one embodiment, outputs the supply signal to the power distributor 190, and in response to the supply signal, the power distributor 190 delivers the electrical power from the propulsion device 180 to the consumer appliance 195. Additionally, the delivery module 330 may output the supply signal to the propulsion device 180 for notification purposes to inform the propulsion device 180 of potential electrical loading.

The power supply line input to the power distributor 190 from the propulsion device 180 may be an independent output from the propulsion device 180. The propulsion device 180 may include and control switching devices, for example, contactors, relays, solid state switching devices, etc., between the propulsion device 180 and the power distributor 190. The propulsion device 180 may continually provide power to the power distributor 190. Alternatively, the delivery module 330 may output a power request signal to the propulsion device 180 to request power be delivered to the power distributor 190. As yet another alternative, the input to the power distributor 190 may be connected to the supply lines feeding, for example, the electrical motor system 242. In all instances, the propulsion device 180 may control the power leaving the propulsion device 180 (i.e., the thick supply lines shown in FIG. 3) and may interrupt the power delivered at any time, for example, if the temperature of the propulsion device 180 is too extreme, an open circuit is detected in the HVIL circuit, if the consumer appliance 195 is drawing too much power via the power distributor 190 that causes the propulsion device 180 to leave a safe operating region, etc. The propulsion device 180 may selectively interrupt power to the power distributor 190 but continue to deliver power to other components, e.g., the electrical motor system, the high-voltage DC/DC converter system 246, etc.

In an alternative configuration, the power delivery system 170 may not include a power distributor 190. In this case, the delivery module 330, in one embodiment, outputs the supply signal directly to the propulsion device 180 in response to determining that the propulsion device state fulfills the power requirements, as shown in the heavy dashed supply line in FIG. 3. The propulsion device 180 then delivers the electrical power to the consumer appliance 195. The propulsion device 180 may immediately supply the power to the consumer appliance 195 in response to the supply signal. Alternatively, the propulsion device 180 may treat the supply signal as a request to supply power to the consumer appliance 195 and satisfy the request if, for example, the propulsion device 180 is operating at a safe temperature, operating in a safe operating region, etc.

The delivery module 330, in one arrangement, includes instructions to selectively engage and/or disengage one or more consumer appliances 195 based on the propulsion device state. One of the benefits of using the power distributor 190 is to control multiple consumer appliances 195. The delivery module 330 may determine that the propulsion device state fulfills the power requirements of all the consumer appliances 195 initially, but as time goes on, the available energy of the propulsion device 180 may become depleted. In efforts to avoid having all the consumer appliances 195 turned off, the delivery module 330 may selectively disengage appliances so as to conserve energy for higher priority appliances, for example, refrigerators, grills, blenders, etc. Each consumer appliance 195 may have a separate switching device within the power distributor 190. Each switching device may have a priority associated with it that may be selectively engaged or disengaged depending on a priority level value of the switching device. The priority level value may be stored in the database 340 and accessed by the delivery module 330.

Furthermore, consumer appliances 195 may be prioritized by the user. For example, the user may enter the priority level value into the database 340 via an input system 230 (illustrated in FIG. 2) in the interior cabin 125 of the vehicle 100, e.g., a touch display, voice commands received by a microphone, etc. The user may enter the priority level value with a wireless device in communication with the communication interface 206 via the network 204.

The user may selectively turn on and off consumer appliances 195 via the input system 230 and/or a wireless device. When turning on or off consumer appliances 195, a user signal indicating the on/off desired state may be received by the connection module 320 from the input system 230 and/or the communication interface 206. In the case of turning on the consumer appliance 195, as set forth above, the connection module 320 may determine the power requirements, the delivery module 330 may determine if the propulsion device state fulfills the power requirements and so on.

As set forth above, the connection module 320 outputs the connection status signal indicating an invalid consumer appliance connection when the connection signal does not indicate a valid power requirement and when the consumer appliance 195 does not provide or maintain the connection signal to the connection module 320. The delivery module 330, in one arrangement, includes instructions to disengage the consumer appliance 195 based on the connection signal. That is, the delivery module 330 outputs the supply signal indicating that power be removed from the one or more consumer appliances 195 based on which consumer appliance 195 is causing the invalid consumer appliance connection. The delivery module 330 may output the supply signal indicating that the power be removed from all the consumer appliances 195 based on the invalid consumer appliance connection. The delivery module 330 may continually monitor the connection status signal and output the supply signal indicating that the power be removed from one or more consumer appliances 195 when the connection status signal indicates an invalid consumer appliance connection.

In one embodiment, the delivery module 330 may output the supply signal indicating that power be removed from the one or more consumer appliances 195 based on a status of the vehicle 100. For example, the delivery module 330 may determine that the vehicle 100 is moving, or the transmission is not in "Park" by accessing the sensor data 219 (FIG. 2) corresponding to one or more vehicle sensors 221 of the sensor system 220, as set forth below. The delivery module 330 may output the supply signal indicating that the power be removed from one or more consumer appliances 195. The delivery module 330 may allow some consumer appliances 195 to remain powered when the vehicle 100 is not in Park. For example, the delivery module 330 may determine that the vehicle 100 is not in Park and output the supply signal indicating that power be removed from all consumer appliances 195 except, e.g., the refrigerator.

The delivery module 330 may output a message indicating that the power delivery system 170 cannot fulfill the power requirements required by the consumer appliance 195. For example, the delivery module 330 may output the message to an output system 235, e.g., a display in the interior cabin 125, speakers of an audio device, etc. As another example, the delivery module 330 may output the message to a wireless device in communication with the communication interface 206. Alternatively, the delivery module 330 may output the message indicating that power has been removed from the consumer appliance 195. Once again, the delivery module 330 may output the message to the output system 235, a wireless device, etc.

Figure 4:
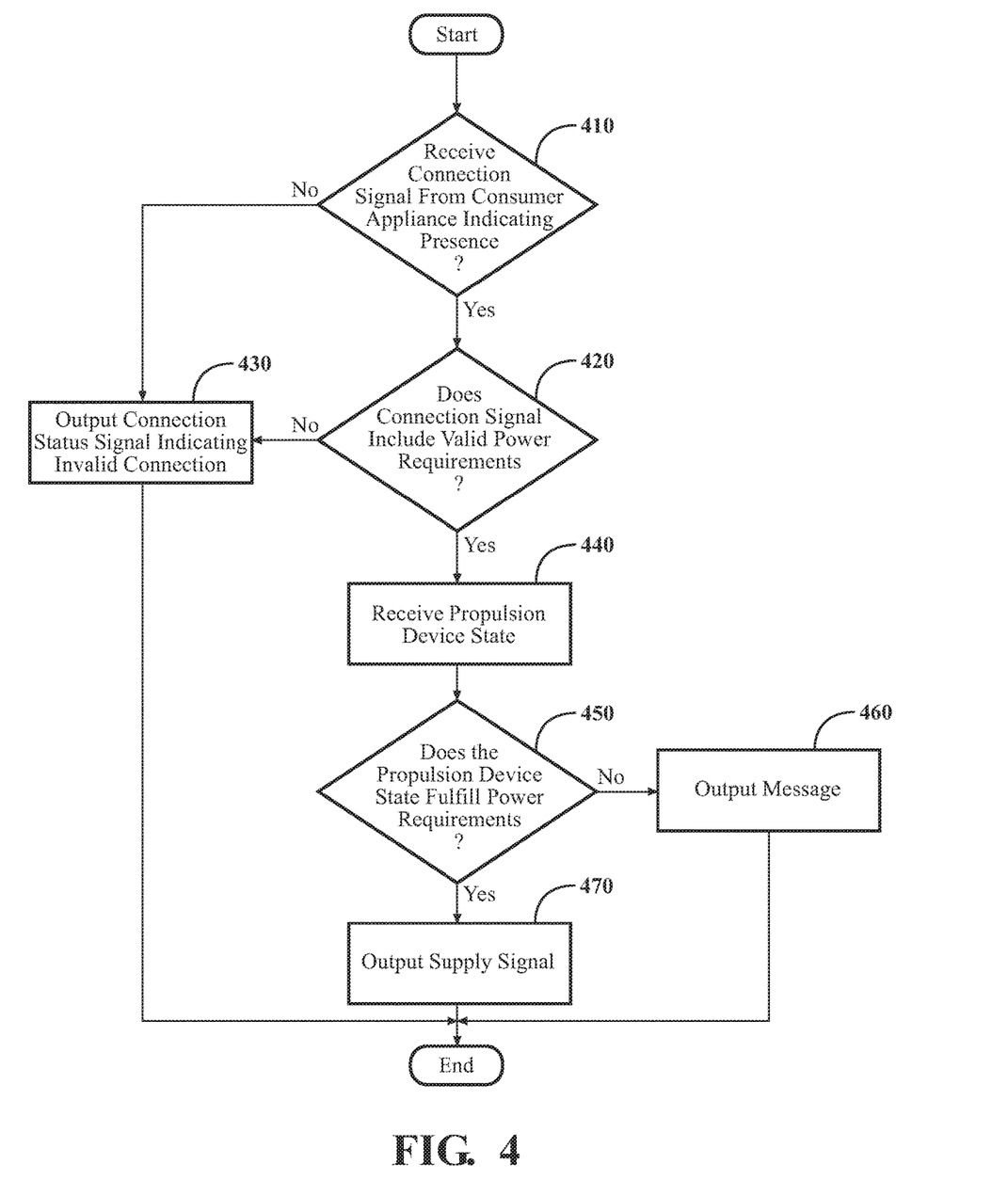
FIG. 4 is a flowchart of a method that is associated with controlling power delivery to the consumer appliance.

FIG. 4 illustrates a flowchart of a method 400 that is associated with controlling power delivery to the consumer appliance 195. The method 400 will be discussed from the perspective of power delivery system 170 of FIGS. 1-3. While the method 400 is discussed in combination with the power delivery system 170, it should be understood that the method 400 is not limited to being implemented within the power delivery system 170, but is instead one example of a system that may implement the method 400. The steps that are illustrated herein as part of the method 400 are not limited to this particular chronological order. Indeed, some of the steps may be performed in a different order than what is shown and/or at least some of the steps shown can occur simultaneously.

At block 410, the connection module 320 receives the connection signal from the consumer appliance 195 indicating the presence of the consumer appliance 195. The connection signal may become active by the consumer appliance 195 being installed into the appliance connector 135, the user activating a power switch associated with the consumer appliance 195, etc. The connection module 320 determines if the consumer appliance 195 is present, i.e., that the consumer appliance 195 is connected to the appliance connector 135 and attempting to communicate. The connection module 320 may interrogate the connection signal to determine presence, as set forth above, of the consumer appliance 195. For example, the connection module 320 may compare a state of the connection signal to a known state that is, for instance, stored in the lookup table 350. If presence is detected, the method 400 proceeds to block 420. Otherwise, the method 400 proceeds to block 430.

At block 420, the connection module 320 determines whether the connection signal includes valid power requirements for the consumer appliance 195. The connection module 320 may utilize the lookup table 350 to validate the analog and/or digital values received by the connection module 320. The connection module may access the remote server 202 via the communication interface 206 to retrieve a valid power requirement value. In either case, if a valid power requirement value is obtained from the lookup table 350 or the remote server 202, the connection module 320 may store the valid power requirement value in the database 340 and the method 400 may then proceed to block 440. Otherwise, the method 400 proceeds to block 430.

At block 430, the connection module 320 outputs the connection status signal indicating an invalid consumer appliance connection. The connection module 320 may output the connection status signal indicating an invalid consumer appliance connection due to the connection signal not being present, receiving an invalid power requirement value or that the consumer appliance 195 does not provide or maintain the connection signal to the connection module 320. The delivery module 330 may continually monitor the connection status signal and output the supply signal indicating that the power be removed from one or more consumer appliances 195 when the connection status signal indicates an invalid consumer appliance connection. The method 400 may then terminate.

At block 440, the delivery module 330 receives a propulsion device state from the propulsion device 180. The propulsion device state includes at least one of an available energy, a state of charge, an output voltage, and a propulsion device temperature that the delivery module 330 may use to determine the available energy of the propulsion device 180. The method 400 then proceeds to block 450.

At block 450, the delivery module 330 may determine the available energy from the propulsion device state. The delivery module 330 may derate the available energy based on one or more propulsion device state parameters, as set forth above. The delivery module 330 may determine an operating time and compare the available energy to the valid power requirement value retrieved from the database 340 for the operating time. The delivery module 330 may then determine if the propulsion device state, and thus the propulsion device 180 can fulfill the power requirements of the consumer appliance 195. If the delivery module 330 determines that the propulsion device 180 can fulfill the power requirements, the method 400 may proceed to block 470. Otherwise the method 400 proceeds to block 460.

At block 470, the delivery module 330 outputs the supply signal to the power distributor 190 and/or the propulsion device 180 depending on the configuration of the power delivery system 170, as set forth above. The propulsion device 180 via the power distributor 190 or the propulsion device 180 itself delivers the electrical power to the consumer appliance 195 in response to the supply signal. The propulsion device 180 may have ultimate control of supplying the electrical power to the consumer appliance 195 based at least on the propulsion device state. The method 400 then terminates.

At block 460, the delivery module 330 may output the message indicating that the power delivery system 170 cannot fulfill the power requirements required by the consumer appliance 195. As set forth above, the message may be output to the output system 235, a wireless device, etc. The method 400 then terminates.

Figure 5:
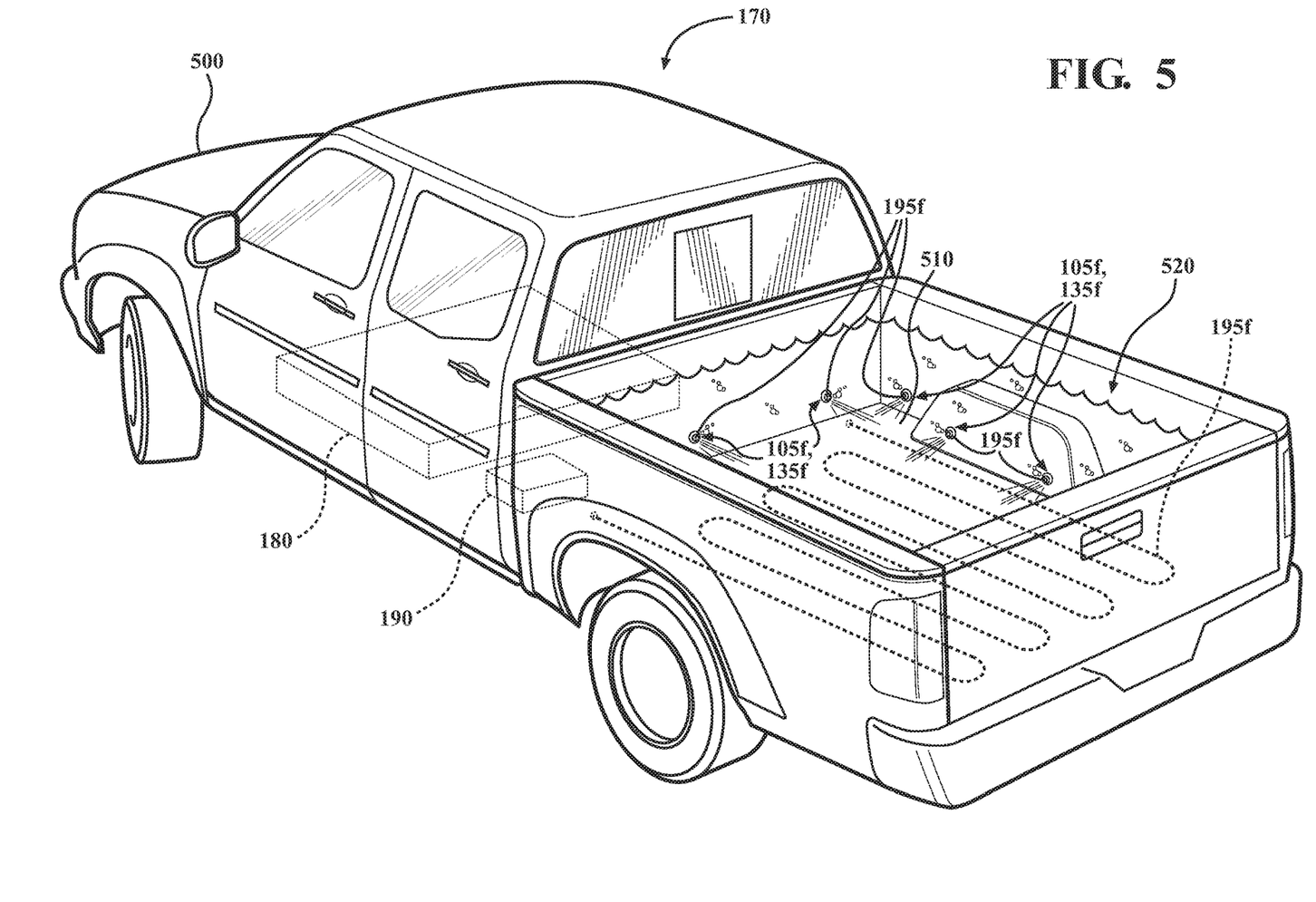
FIG. 5 is a perspective view of another example of a vehicle that includes the power delivery system.

As a further example of how the power delivery system 170 may be implemented, FIG. 5 will now be discussed. FIG. 5 illustrates an example of a vehicle 500 that includes the power delivery system 170. The power delivery system 170, in one arrangement, includes a consumer appliance 195f, for example, a water heating element and jets that form a hot tub. The heating element may include a protective layer 510 that thermally insulates a user and seals the hot tub for holding water. In the same manner as above, the power delivery system 170 determines presence of the consumer appliance 195f, whether the consumer appliance 195f is communicating valid power requirements, that the propulsion device 180 can fulfill the power requirements of the appliance 195f and delivers the electrical power accordingly.

The vehicle 500 includes, in one arrangement, compartments 105f accessible from the exterior of the vehicle 500 and the compartments 105f are configured to receive the consumer appliance 195f. For example, the compartments 150f may be cavities along a truck bed 520 of the vehicle 500 configured to receive the consumer appliances 195f, i.e., the water heating element and the jets. The compartments 105f may include appliance connectors 135f that allow for the consumer appliance 195f to receive the electrical power from the propulsion device 180 and communicate with the power delivery system 170.

The jets of consumer appliance 195f may be manipulatable to change the direction of a water stream. The temperature of the water heating element of the consumer appliance 195f may be changed from a wireless device in communication with the power delivery system 170 via the communication interface 206. The temperature may be changed via the input system 230, for example, a temperature switch (not shown) located in the truck bed 520 in communication with the power delivery system 170. As set forth above, connection module 320 determines if the updated power requirement is valid and updates the connection status signal accordingly.

FIG. 2 will now be discussed in full detail as an example environment within which the system and methods disclosed herein may operate. The vehicle 100, 500 can include one or more processors 210. In one or more arrangements, the processor(s) 210 can be a main processor of the vehicle 100, 500. For instance, the processor(s) 210 can be an electronic control unit (ECU). The vehicle 100, 500 can include one or more data stores 215 for storing one or more types of data. The data stores 215 can include volatile and/or non-volatile memory. Examples of suitable data stores 215 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 215 can be a component of the processor(s) 210, or the data store 215 can be operatively connected to the processor(s) 210 for use thereby. The term "operatively connected," as used throughout this description, can include direct or indirect connections, including connections without direct physical contact.

The one or more data stores 215 can include the sensor data 219. In this context, "sensor data" means any information about the sensors that the vehicle 100, 500 is equipped with, including the capabilities and other information about such sensors. As will be explained below, the vehicle 100, 500 can include the sensor system 220. The sensor data 219 can relate to one or more sensors of the sensor system 220. As an example, in one or more arrangements, the sensor data 219 can include information on speed of the vehicle 100, 500 from one or more vehicle sensors 221 of the sensor system 220.

In some instances, at least a portion of the sensor data 219 can be located in one or more data stores 215 located onboard the vehicle 100, 500. Alternatively, or in addition, at least a portion of the sensor data 219 can be located in one or more data stores 215 that are located remotely from the vehicle 100, 500.

As noted above, the vehicle 100, 500 can include the sensor system 220. The sensor system 220 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor(s) 210 to keep up with some external process.

In arrangements in which the sensor system 220 includes a plurality of sensors, the sensors can work independently from each other. Alternatively, two or more of the sensors can work in combination with each other. In such case, the two or more sensors can form a sensor network. The sensor system 220 and/or the one or more sensors can be operatively connected to the processor(s) 210, the data stores 215, and/or another element of the vehicle 100, 500 (including any of the elements shown in FIG. 2). The sensor system 220 can acquire data of at least a portion of the external environment of the vehicle 100, 500 (e.g., nearby vehicles).

The sensor system 220 can include any suitable type of sensor. Various examples of different types of sensors will be described herein. However, it will be understood that the embodiments are not limited to the particular sensors described. The sensor system 220 can include the one or more vehicle sensors 221. The vehicle sensor(s) 221 can detect, determine, and/or sense information about the vehicle 100, 500 itself. In one or more arrangements, the vehicle sensor(s) 221 can be configured to detect, and/or sense position and orientation changes of the vehicle 100, 500, such as, for example, based on inertial acceleration. In one or more arrangements, the vehicle sensor(s) 221 can include one or more accelerometers, one or more gyroscopes, an inertial measurement unit (IMU), a dead-reckoning system, a global navigation satellite system (GNSS), a global positioning system (GPS), a navigation system, and/or other suitable sensors. The vehicle sensor(s) 221 can be configured to detect, and/or sense one or more characteristics of the vehicle 100, 500. In one or more arrangements, the vehicle sensor(s) 221 can include a speedometer to determine a current speed of the vehicle 100, 500. In other arrangements, the vehicle sensor(s) can include a transmission range sensor to determine the position of the transmission, e.g., Park, Neutral, Reverse, $1^{st}$ gear, etc.

The vehicle 100, 500 can include an input system 230. An "input system" includes any device, component, system, element or arrangement or groups thereof that enable information/data to be entered into a machine. The input system 230 can receive an input from a vehicle passenger (e.g. an operator or a passenger). The vehicle 100, 500 can include an output system 235. An "output system" includes any device, component, or arrangement or groups thereof that enable information/data to be presented to a vehicle passenger (e.g. a person, a vehicle passenger, etc.).

The vehicle 100, 500 can include one or more vehicle systems 240. Various examples of the one or more vehicle systems 240 are shown in FIG. 2. However, the vehicle 100, 500 can include more, fewer, or different vehicle systems. It should be appreciated that although particular vehicle systems are separately defined, each or any of the systems or portions thereof may be otherwise combined or segregated via hardware and/or software within the vehicle 100, 500. The vehicle system 240 may include the electric motor system 242, the high-voltage charging system 244 and the high-voltage DC/DC converter system 246. As stated above, the electric motor system 242 provides propulsion to the vehicle 100, 500 when coupled to the propulsion device 180. The high-voltage charging system 244 allows the propulsion device 180 to be charged, for example, when it becomes depleted. The high-voltage charging system 244 may interface to an AC source, for example, a 120/240 VAC electrical outlet. The high-voltage DC/DC converter system may convert the propulsion device 180 output voltage to alternate DC voltage levels for use by other vehicle systems 240.

The processor(s) 210 and/or the power delivery system 170 can be operatively connected to communicate with the various vehicle systems 240 and/or individual components thereof. For example, returning to FIG. 2, the processor(s) 210 can be in communication to send and/or receive information from the various vehicle systems 240 to control the movement, speed, maneuvering, heading, direction, etc. of the vehicle 100, 500. The processor(s) 210 and the power delivery system 170 may control some or all of these vehicle systems 240.

As used herein, "cause" or "causing" means to make, force, compel, direct, command, instruct, and/or enable an event or action to occur or at least be in a state where such event or action may occur, either in a direct or indirect manner.

The vehicle 100, 500 can include one or more actuators 250. The actuators 250 can be any element or combination of elements operable to modify, adjust and/or alter one or more of the vehicle systems 240 or components thereof responsive to receiving signals or other inputs from the processor(s) 210. Any suitable actuator can be used. For instance, the one or more actuators 250 can include motors, pneumatic actuators, hydraulic pistons, relays, solenoids, and/or piezoelectric actuators, just to name a few possibilities.

The vehicle 100, 500 can include one or more modules, at least some of which are described herein. The modules can be implemented as computer-readable program code that, when executed by a processor, implement one or more of the various processes described herein. One or more of the modules can be a component of the processor(s) 210, or one or more of the modules can be executed on and/or distributed among other processing systems to which the processor(s) 210 is operatively connected. The modules can include instructions (e.g., program logic) executable by one or more processors 210. Alternatively, or in addition, one or more data stores 215 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-5, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A power delivery system for controlling power delivery to a consumer appliance in a vehicle, the power delivery system comprising:
one or more processors; and
a memory communicably coupled to the one or more processors and storing:
a connection module including instructions that when executed by the one or more processors cause the one or more processors to:
receive a connection signal from the consumer appliance indicating presence of the consumer appliance, wherein the connection signal includes power requirements for the consumer appliance; and
a delivery module including instructions that when executed by the one or more processors cause the one or more processors to:
directly provide electrical power from a propulsion device providing DC voltage to the consumer appliance without substantially lowering a voltage level of the propulsion device.

2. The power delivery system of claim 1, wherein the delivery module further includes instructions to directly provide the electrical power from the propulsion device providing DC voltage to the consumer appliance without converting a voltage type of the propulsion device from DC to AC.

3. The power delivery system of claim 1, wherein the delivery module further includes instructions to disengage the consumer appliance based the connection signal.

4. The power delivery system of claim 1, wherein the delivery module further includes instructions to receive a propulsion device state from the propulsion device, and to determine whether the propulsion device state fulfills the power requirements.

5. The power delivery system of claim 4, wherein the delivery module further includes instructions to output, in response to a determination that the propulsion device state does not fulfill the power requirements, a message to at least one of an output system of the vehicle or a wireless device.

6. The power delivery system of claim 4, wherein the propulsion device state includes at least one of an available energy, a state of charge, an output voltage, or a propulsion device temperature.

7. The power delivery system of claim 4, wherein the delivery module further includes instructions to output, in response to a determination that the propulsion device state fulfills the power requirements, a supply signal to a power distributor, the power distributor configured to deliver the electrical power from the propulsion device to the consumer appliance in response to a receipt of the supply signal.

8. The power delivery system of claim 4, wherein the delivery module further includes instruction to output, in response to a determination that the propulsion device state fulfills the power requirements, a supply signal to the propulsion device, the propulsion device configured to deliver the electrical power to the consumer appliance in response to a receipt of the supply signal.

9. A power delivery system for controlling power delivery to a consumer appliance in a vehicle, the power delivery system comprising:
one or more processors; and
a memory communicably coupled to the one or more processors and storing:
a connection module including instructions that when executed by the one or more processors cause the one or more processors to:
receive a connection signal from the consumer appliance indicating presence of the consumer appliance, wherein the connection signal includes power requirements for the consumer appliance; and
a delivery module including instructions that when executed by the one or more processors cause the one or more processors to:
directly provide electrical power from a propulsion device providing DC voltage to the consumer appliance without substantially lowering a voltage level of the propulsion device;
receive a propulsion device state from the propulsion device, and to determine whether the propulsion device state fulfills the power requirements; and
selectively engage and disengage one or more consumer appliances based on the propulsion device state.

10. The power delivery system of claim 1, wherein the vehicle includes a compartment accessible from an exterior of the vehicle, the compartment configured to receive the consumer appliance.

11. A method for controlling power delivery to a consumer appliance in a vehicle, comprising:
receiving a connection signal from the consumer appliance indicating presence of the consumer appliance, wherein the connection signal includes power requirements for the consumer appliance; and
directly providing electrical power from a propulsion device providing DC voltage to the consumer appliance without substantially lowering a voltage level of the propulsion device.

12. The method of claim 11, wherein the directly providing the electrical power from the propulsion device providing DC voltage to the consumer appliance comprises directly providing the electrical power from the propulsion device providing DC voltage to the consumer appliance without converting a voltage type of the propulsion device from DC to AC.

13. The method of claim 11, further comprising:
receiving a propulsion device state from the propulsion device; and
determining whether the propulsion device state fulfills the power requirements.

14. The method of claim 13, further comprising:
in response to determining the propulsion device state fulfills the power requirements, outputting a supply signal to a power distributor, the power distributor configured to deliver the electrical power from the propulsion device to the consumer appliance in response to a receipt of the supply signal.

15. The method of claim 13, further comprising:
in response to determining the propulsion device state fulfills the power requirements, outputting a supply signal to the propulsion device, the propulsion device configured to deliver the electrical power to the consumer appliance in response to a receipt of the supply signal.

16. The method of claim 13, further comprising:
selectively engaging and disengaging one or more consumer appliances based on the propulsion device state.

17. A non-transitory computer-readable medium for controlling power delivery to a consumer appliance in a vehicle and storing instructions that when executed by one or more processor cause the one or more processors to:
receive a connection signal from the consumer appliance indicating presence of the consumer appliance, wherein the connection signal includes power requirements for the consumer appliance; and
directly provide electrical power from a propulsion device providing DC voltage to the consumer appliance without substantially lowering a voltage level of the propulsion device.

18. The non-transitory computer-readable medium of claim 17, wherein the instructions that directly provide the electrical power from the propulsion device providing DC voltage to the consumer appliance comprise instructions that directly provide the electrical power from the propulsion device providing DC voltage to the consumer appliance without converting a voltage type of the propulsion device from DC to AC.

19. The non-transitory computer-readable medium of claim 17, wherein the computer-readable medium further includes instructions that when executed by the one or more processors cause the one or more processors to:
receive a propulsion device state from the propulsion device, and determine whether the propulsion device state fulfills the power requirements.

20. The non-transitory computer-readable medium of claim 19, wherein the computer-readable medium further includes instructions that when executed by the one or more processors cause the one or more processors to:
in response to a determination that the propulsion device state fulfills the power requirements, output a supply signal to a power distributor, the power distributor configured to deliver the electrical power from the propulsion device to the consumer appliance in response to a receipt of the supply signal.

* * * * *